United States Patent
Kim et al.

(10) Patent No.: US 9,167,697 B2
(45) Date of Patent: Oct. 20, 2015

(54) DISPLAY PANEL AND BONDING APPARATUS FOR MANUFACTURING THE SAME

(71) Applicant: Samsung Display Co., Ltd., Yongin, Gyeonggi-Do (KR)

(72) Inventors: Joon-Sam Kim, Yongin (KR); Jong-Hwan Kim, Yongin (KR); Sang-Won Yeo, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 211 days.

(21) Appl. No.: 13/792,362

(22) Filed: Mar. 11, 2013

(65) Prior Publication Data

US 2014/0140029 A1    May 22, 2014

(30) Foreign Application Priority Data

Nov. 19, 2012    (KR) .................. 10-2012-0131183

(51) Int. Cl.
| H05K 1/16 | (2006.01) |
|---|---|
| H05K 1/18 | (2006.01) |
| H05K 3/32 | (2006.01) |
| G09G 3/32 | (2006.01) |

(52) U.S. Cl.
CPC .............. *H05K 1/181* (2013.01); *H05K 3/323* (2013.01); *G09G 3/3208* (2013.01); *H05K 2201/2009* (2013.01); *H05K 2203/0278* (2013.01); *H05K 2203/166* (2013.01)

(58) Field of Classification Search
CPC ............ H05K 1/00; H05K 3/32; H01L 21/70; H01L 21/98; H01L 23/48; H01L 23/498; G02F 1/13; G02F 1/1343; G02F 1/1345

USPC ......... 174/260, 250; 361/760; 257/40, 49, 72, 257/124; 349/59, 106, 149, 150, 151
See application file for complete search history.

(56) References Cited

U.S. PATENT DOCUMENTS

| 5,636,329 | A | * | 6/1997 | Sukegawa et al. ............ 349/149 |
|---|---|---|---|---|
| 5,835,177 | A | * | 11/1998 | Dohjo et al. .................. 349/147 |
| 6,172,878 | B1 | * | 1/2001 | Takabayashi et al. ........ 361/760 |
| 6,407,508 | B1 | * | 6/2002 | Kawada et al. ............ 315/169.3 |
| 6,411,353 | B1 | * | 6/2002 | Yarita et al. .................... 349/59 |
| 2002/0047133 | A1 | * | 4/2002 | Nakahara et al. ............ 257/124 |
| 2002/0135293 | A1 | * | 9/2002 | Aruga ........................... 313/493 |
| 2003/0001992 | A1 | * | 1/2003 | Kawase et al. ............... 349/106 |
| 2006/0072060 | A1 | * | 4/2006 | Lu et al. ....................... 349/151 |
| 2009/0261337 | A1 | * | 10/2009 | Sakakura et al. .............. 257/72 |
| 2011/0037059 | A1 | * | 2/2011 | Gyoda ........................... 257/40 |
| 2011/0155318 | A1 | * | 6/2011 | Shibata et al. ............. 156/275.5 |
| 2011/0267573 | A1 | * | 11/2011 | Lee ............................... 349/150 |

FOREIGN PATENT DOCUMENTS

| JP | 2002-076208 | 3/2002 |
|---|---|---|
| JP | 2009-192796 | 8/2009 |
| KR | 10-0500636 | 7/2005 |
| KR | 10-2012-0059949 | 6/2012 |

* cited by examiner

*Primary Examiner* — Xiaoliang Chen
(74) *Attorney, Agent, or Firm* — Robert E. Bushnell, Esq.

(57) ABSTRACT

A display panel that includes: a display substrate; a driving chip bonded onto the display substrate; an anisotropic conductive film provided between the display substrate and the driving chip; and a protection film attached to a bottom of the display substrate, and the protection film is provided with a bending prevention means.

4 Claims, 10 Drawing Sheets

DISPLAY PANEL AND BONDING APPARATUS FOR MANUFACTURING THE SAME

CLAIM PRIORITY

This application makes reference to, incorporates the same herein, and claims all benefits accruing under 35 U.S.C. §119 from an application earlier filed in the Korean Intellectual Property Office on 19 Nov. 2012 and there duly assigned Ser. No 10-2012-0131183.

BACKGROUND OF THE INVENTION (a) Field of the Invention

The present invention generally relates to a display panel and a bonding apparatus.

(b) Description of the Related Art

An organic light emitting diode (OLED) display includes a display substrate providing a pixel area and a non-pixel area and a sealing substrate disposed to be opposite to the display substrate for encapsulation and bonded to the substrate by a sealant like epoxy.

The above information disclosed in this Related Art section is only for enhancement of understanding of the background of the invention and therefore it may contain information that does not form the prior art that is already known in this country to a person of ordinary skill in the art.

SUMMARY OF THE INVENTION

The present invention has been made in an effort to provide a display panel that can stably compress a driving chip while preventing a display substrate from being bent during a chip on glass bonding process.

An exemplary embodiment of the present invention provides a bonding apparatus that can stably compress a driving chip while preventing a display substrate from being bent during a chip on glass bonding process.

One aspect of the present invention provides a display panel used in a display device. The display panel includes: a display substrate; a driving chip bonded onto the display substrate; an anisotropic conductive film provided between the display substrate and the driving chip; and a protection film attached to a bottom of the display substrate, and the protection film may be provided with a bending prevention means.

In this case, the bending prevention means may be an opening formed in the protection film.

The opening may be formed in a location corresponding to a location of the driving chip.

The size of the opening may correspond to the size of the driving chip.

Meanwhile, an organic light emitting element may be formed in the display substrate.

Another aspect of the present invention provides a bonding apparatus that bonds a driving chip to a display substrate. The bonding apparatus includes: a compression means provided in an upper portion of the display substrate and compressing the driving chip; and a support stage provided in a lower portion of the display substrate to support the display substrate, and a bending prevention means that prevents the display substrate from being bent may be formed on the support stage.

In this case, the bending prevention means may be a stepped groove formed in the support stage.

The stepped groove may be formed in a location corresponding to a location of the driving chip.

The size of the stepped groove may correspond to the size of the driving chip.

The compression means may include a compression heat where a heat source may be provided and a compression tip attached to a lower portion of the compression head.

The thickness of the display substrate may be less than 0.3 mm.

According to the exemplary embodiments of the present invention, a bending prevention means may be provided in a lower portion of the display substrate and thus bending of the display substrate during bonding of the driving chip to the display substrate can be prevented.

According to the exemplary embodiments of the present invention, a bending prevention means may be provided in a bonding apparatus provided in a lower portion of the display substrate so that bending of the display substrate during bonding of the driving chip to the display substrate can be prevented.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE EMBODIMENTS

Figure 1:
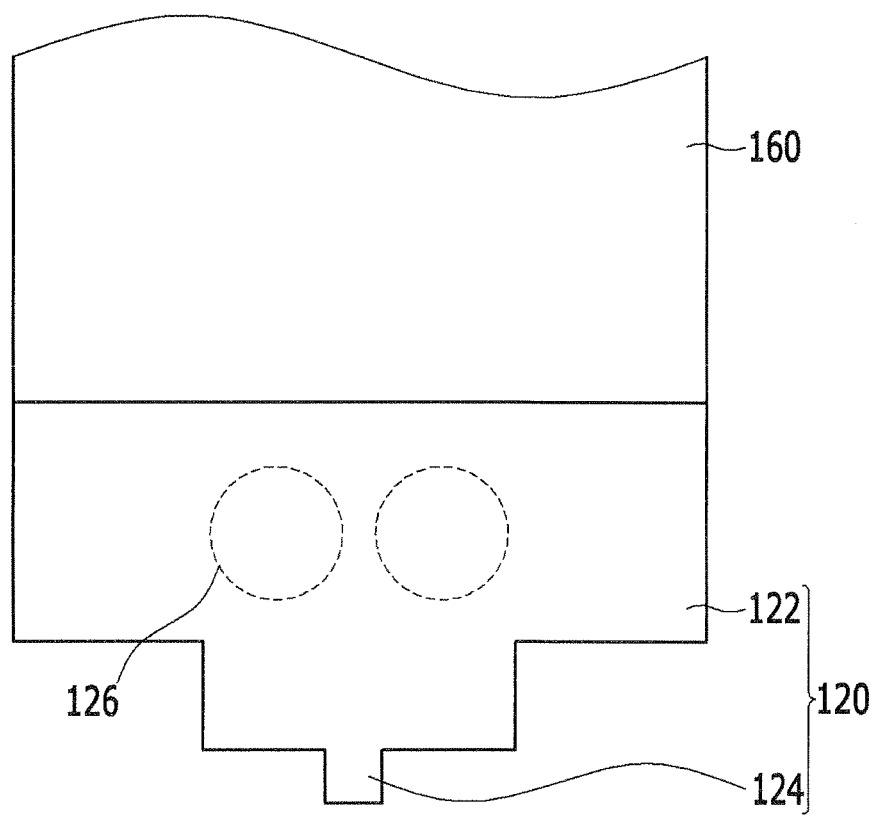
FIG. 1 is an enlarged side view of a compression means in a bonding apparatus according to an exemplary embodiment of the present invention.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an OLED display a plurality of light emitting elements are connected in a matrix format to form a pixel between a scan line and a data line are formed in the pixel area of the display substrate, and a scan driver and a data driver extended from the scan line and the data line of the pixel area to supply signals provided from an external source through a pad are formed in the non-pixel area of the display substrate. The scan driver and the data driver include driving circuits for generating a scan signal and a data signal by processing the externally provided signals, and may be formed during a manufacturing process of the light emitting element or manufactured as a separate integrated circuit chip and then mounted to the display substrate.

In case that the scan driver and the data driver are provided as the integrated circuit chip and then mounted to the display substrate, a drive IC chip may be mounted using a tape automated bonding (TAB) method in which the drive IC chip is mounted to a tape carrier package (TCP) and connected to a pad of the display substrate or may be mounted using a chip on glass (COG) method in which the drive IC chip is directly attached to the pad of the display substrate. The COG method has a simple structure and consumes a small area compared to the TAB method and thus is widely applicable in middle/small-sized display panel of a mobile communication product.

Through the COG method, bumps formed in an input terminal and an output terminal of the driver IC chip are compressed to an inner lead bonding (ILB) pad and an out lead bonding (OLB) pad formed in the display substrate through a conductive ball included in an anisotropic conductive film (AFC), and a flexible printed circuit 9FPC) is connected to the input pan connected to the inner lead bonding pad through a film on glass (FOG) method. Thus, when a control signal and a data signal are provided from an external source through the flexible printed circuit, the drive IC chip generates a scan signal and a data signal and transmits the generated signal to a light emitting element through a scan line and a data line connected to the out lead bonding pad.

In particular, according to the COG method, a driver IC chip is aligned to the display substrate to which the anisotropic conductive film is attached, and the bump is electrically connected to the pad of the display substrate by applying a load using a compression chip of a bonding apparatus for a display device.

However, when the display substrate is thin and made of a flexible material, the display substrate is bent so that stable compression quality cannot be assured using a conventional bonding method.

Figure 2:
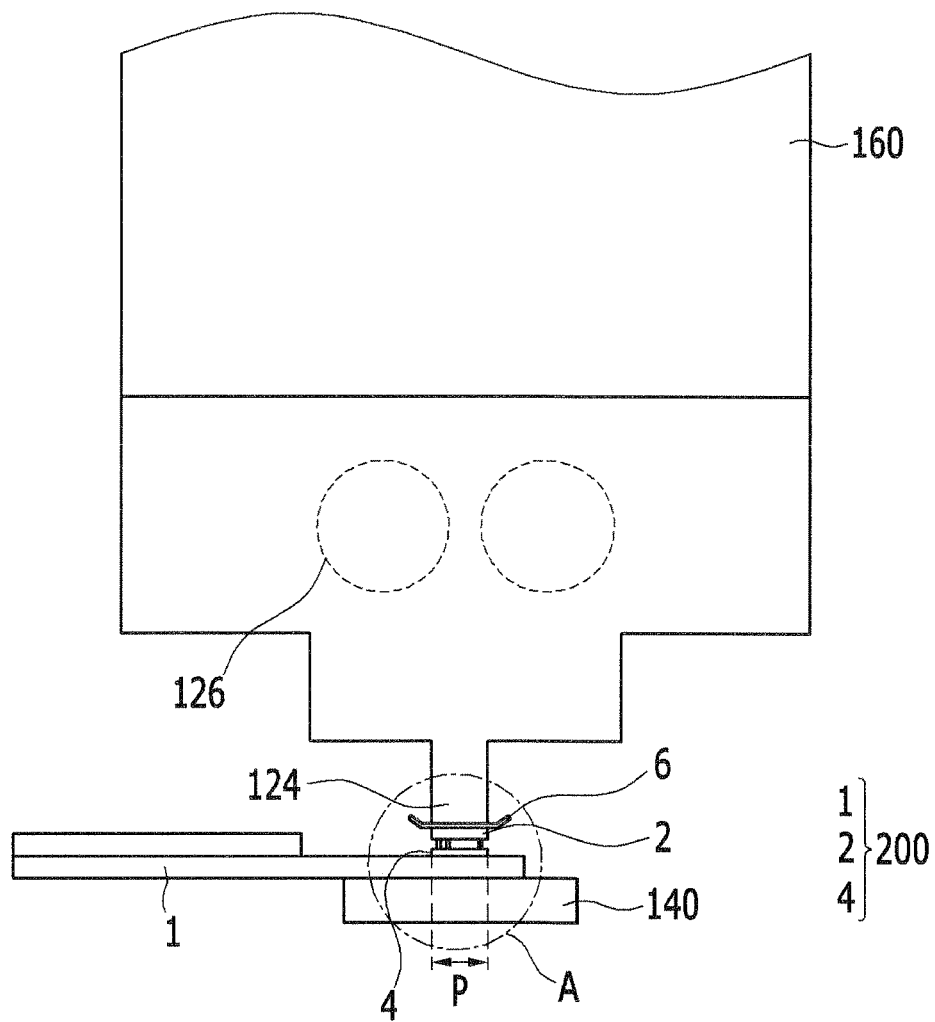
FIG. 2 shows a driving chip in a state of being compressed by the compression means of the bonding apparatus according to the exemplary embodiment of the present invention.
Figure 3:
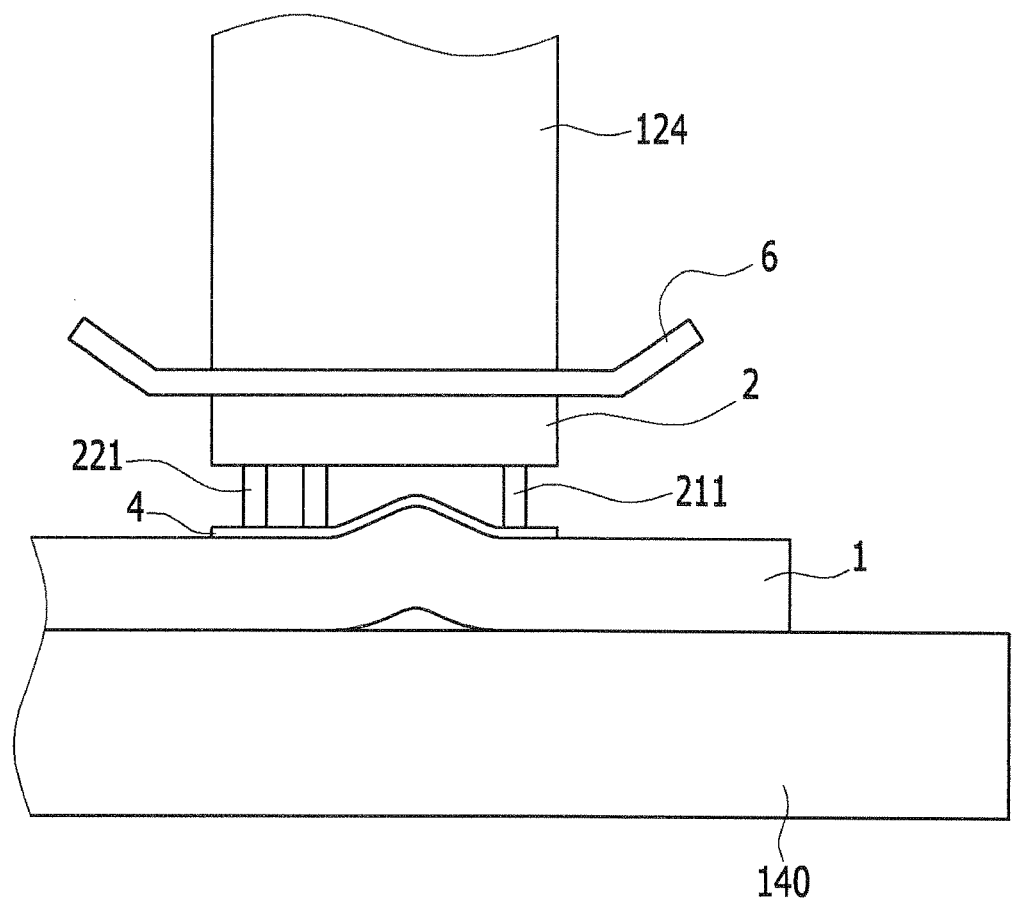
FIG. 3 is an enlarged view of "A" in FIG. 2.

FIG. 1 is an enlarged side view of a compression means in a bonding apparatus according to an exemplary embodiment of the present invention. FIG. 2 shows a state that a driving chip may be compressed using the compression means of the bonding apparatus according to the exemplary embodiment of the present invention. FIG. 3 is an enlarged view of "A" of FIG. 2.

Referring to FIG. 2, a display panel 200 according to an exemplary embodiment of the present invention may include a display substrate 1, a driving chip 2, an anisotropic conductive film 4.

Prior to detailed description of the display panel 200 according to the exemplary embodiment of the present invention, the bonding apparatus 100 according to the exemplary embodiment of the present invention will be partially described for convenience of understanding.

Referring to FIG. 1 to FIG. 3, a bonding apparatus 100 according to the exemplary embodiment of the present invention is an apparatus for bonding the driving chip 2 to a bonding portion P of the display substrate 1, and may include a compression means 120, a transfer portion 160, and a support stage 140.

The compression means 120 may be formed to compress the driving chip 2 to the anisotropic conductive film 4 attached to the bonding portion P of the display substrate 1, and the transfer portion 160 may be provided in an upper portion of the compression means 120 to transfer the compression means 120 to an appropriate location.

In addition, the support stage 140 may be provided to support the display substrate 1 during compression of the driving chip 2, and may be provided, for example, in a lower portion of the display substrate 1 corresponding to the compression means 120 provided in the upper portion of the display substrate 1.

In this case, the support stage 140 may be formed in the shape of a flat plate and may be made of a hard material to stably support the display substrate 1, and according to the exemplary embodiment of the present invention, the material of the support stage 140 may include stainless.

As shown in FIG. 1 to FIG. 3, the compression means 120 according to the exemplary embodiment of the present invention may include a compression head 122 where a heat source 126 may be provided and a compression tip 124 compressing the driving chip 2 to the anisotropic conductive film 4 attached to the display substrate 1.

In this case, the heat source 126 provided in the compression head 122 may be a heating coil, and heat generated from the heat source 126 may be applied to the anisotropic conductive film 4 and thus the driving chip 2 can be easily bonded to the bonding portion P of the display substrate 1 through the anisotropic conductive film 4.

Meanwhile, the driving chip 2 may include input pads 211 arranged in one column, output pads 221 arranged in a plurality of columns, and a plurality of side pads 231 (refer to FIG. 6) arranged in sides.

In this case, the alignment of the input pads 211 and the alignment of the output pads 221 are not restrictive.

The compression tip 124 of the compression means 120 may be provided to compress the input pads 211 and the output pad 221 of the driving chip 2, and may be attached to a lower surface of the compression head 122.

In this case, refereeing to FIG. 3, when the driving chip 2 may be compressed to the anisotropic conductive film 4 using the compression tip 124, the compression tip 124 compresses the driving chip 2 from an upper portion of the display substrate 1 and the flat-shaped support stage 140 supports the display substrate 1 from a lower portion of the display substrate 1.

In case of the display substrate 1 having a thickness of less than 0.3 mm according to the exemplary embodiment of the present invention, as shown in FIG. 3, the bonding portion P of the display substrate 1 to which the driving chip 2 may be compressed is bent to a direction of the driving chip 2.

This is because that a space having a constant height may be formed by the protruding input pads 211 and the protruding output pads 221 provided in the driving chip 2 and a stress due to the compression may be concentrated to the space so that the display substrate 1 may be bent to a direction of the space.

Accordingly, connection of the driving chip 2 may be non-uniform, and thus a bending prevention means in the display panel 200 and the bonding apparatus 100 according to the exemplary embodiment of the present invention will now be described in further detail with reference to the drawings.

For convenience of description, a method for bonding the driving chip 2 to the display substrate 1 will be described together.

Figure 4:
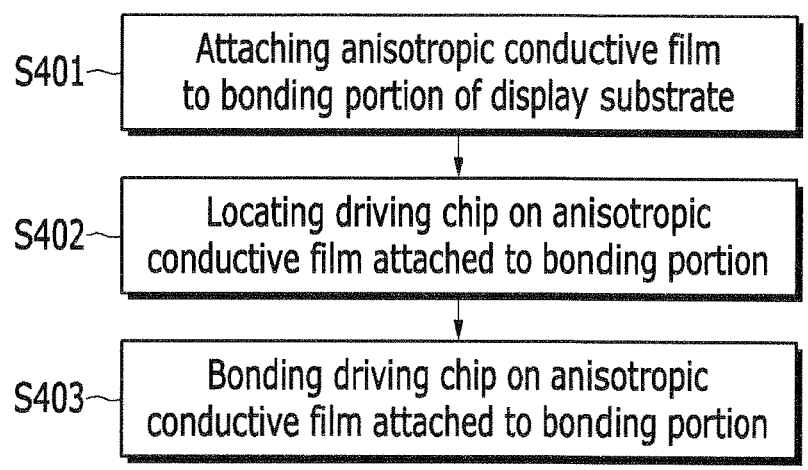
FIG. 4 is a flowchart of a method for bonding the driving chip to a display substrate.
Figure 5:
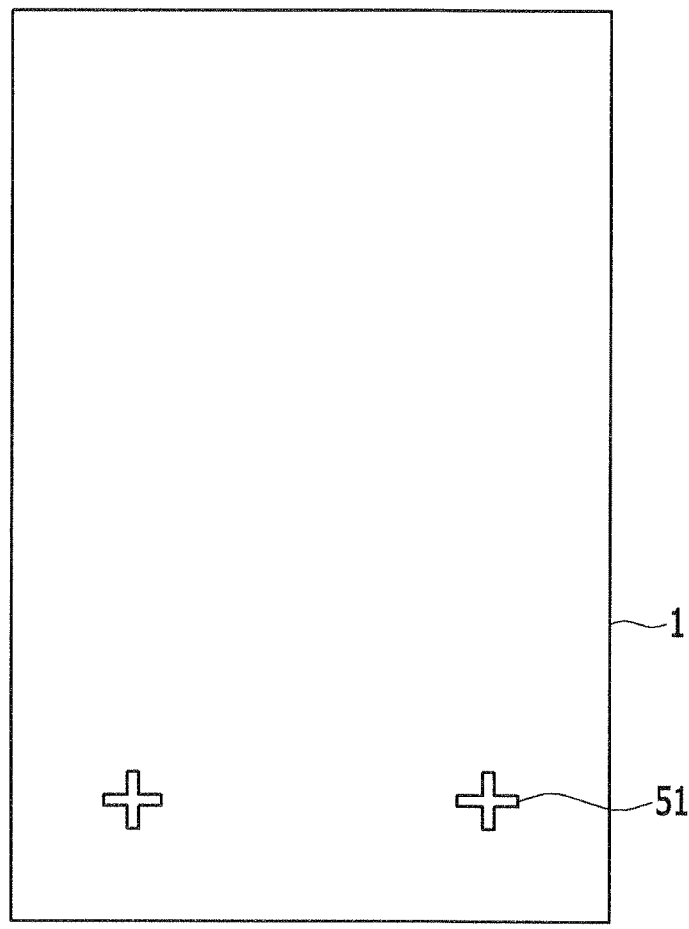
FIG. 5 shows a first aligning device used in bonding of the driving chip.
Figure 6:
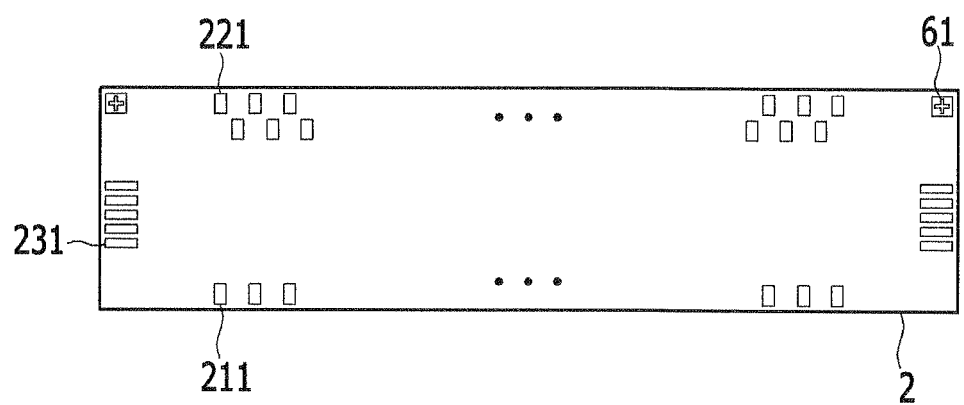
FIG. 6 shows a second aligning device used in bonding of the driving chip.
Figure 7:
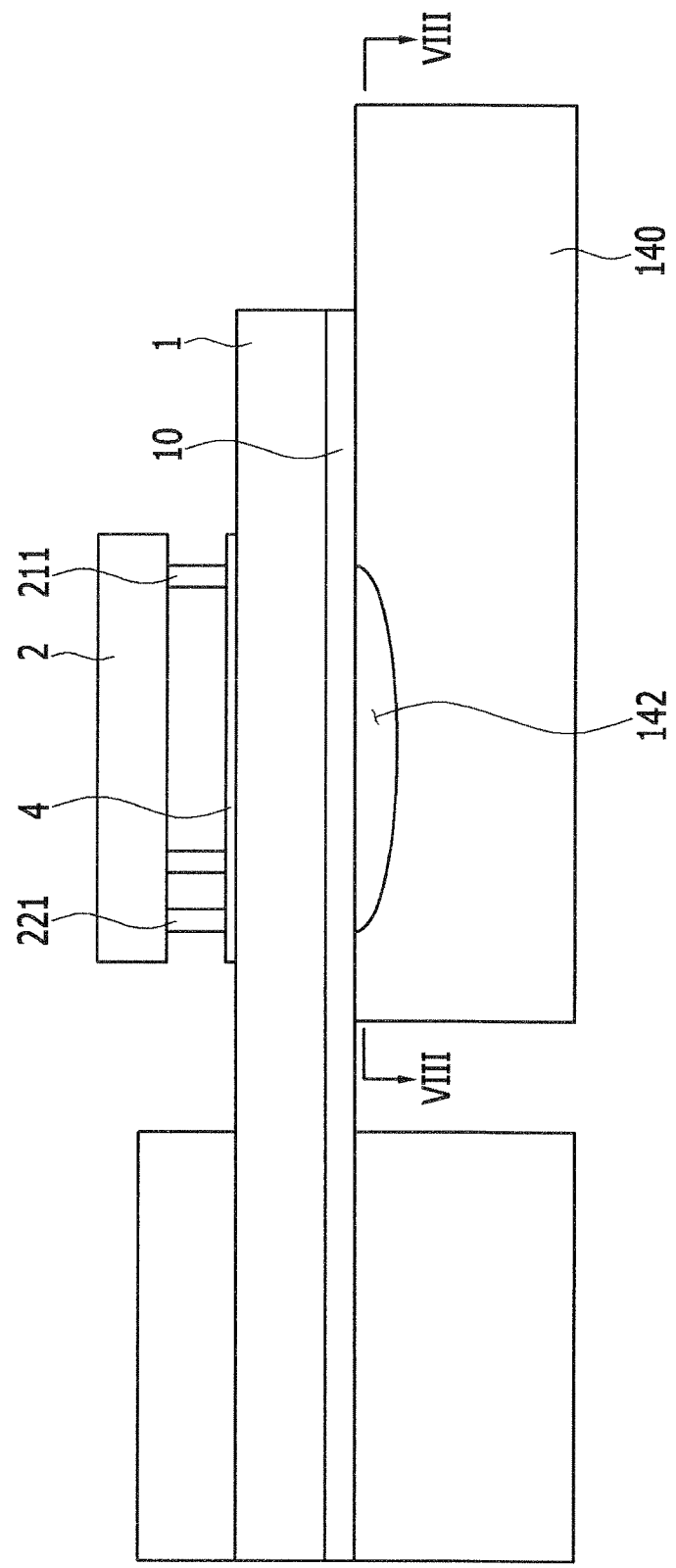
FIG. 7 shows a state that the driving chip is being bonded by the bonding apparatus according to the exemplary embodiment of the present invention.
Figure 8:
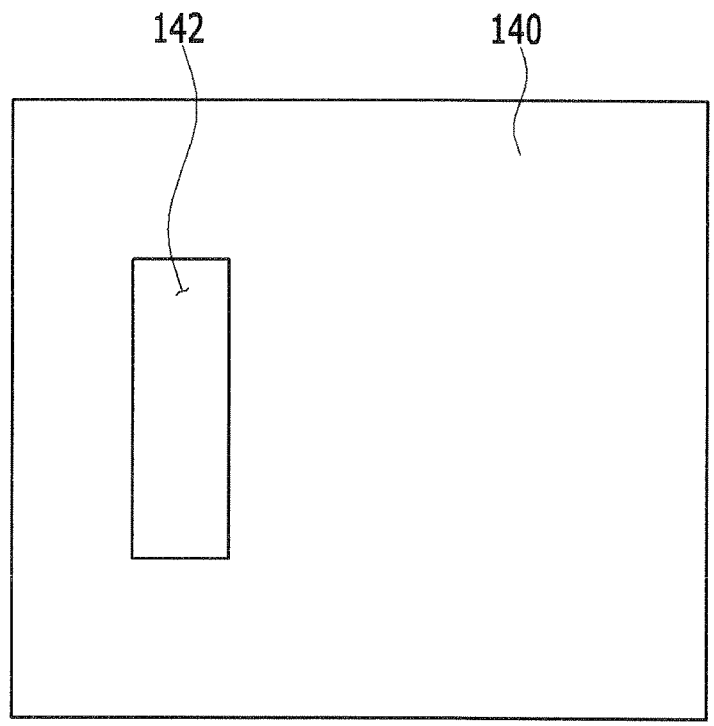
FIG. 8 is a cross-sectional view of FIG. 7, taken along the line VIII-VIII.

FIG. 4 is a flowchart of a method for bonding the driving chip to the display substrate. FIG. 5 shows a first aligning device used in the bonding of the driving chip. FIG. 6 is a second aligning device used in the bonding of the driving chip. FIG. 7 shows the driving chip in the bonding state by the bonding apparatus according to the exemplary embodiment of the present invention. FIG. 8 is a cross-sectional view of FIG. 7, taken along the line VIII-VIII.

Referring to FIG. 4, a process for manufacturing the display panel 200 may include three processes for bonding the driving chip 2 to the bonding portion P of the display substrate 1 using the bonding apparatus 100.

First, the anisotropic conductive film 4 may be attached to the bonding portion P of the display substrate 1 (S401).

In this case, the anisotropic conductive film 4 may be attached to the bonding portion P of the display substrate 1 using a known film bonding facility (not shown) that attaches a film member to a substrate.

Meanwhile, in the display panel 200 according to the exemplary embodiment of the present invention, the anisotropic conductive film 4 may be formed of a double-sided adhesive tape formed by dispersely mixing a polymer cured by heat and micro conductive particles.

Accordingly, when a pressure is applied from upper and lower portion of the anisotropic conductive film 4, the conductive particles are exploded and thus the polymer may be wholly filled in the double-sided adhesive tape, thereby achieving conductivity and adherence.

The conductive particles may metal such as include carbon fiber, nickel (Ni), platinum (Pt), and the like or an alloy thereof, and the polymer may include styrene butadiene rubber), polyvinyl, butylene, epoxy resin, polyurethane, and acrylic resin.

In the display panel 200 according to the exemplary embodiment of the present invention, the display substrate 1 may have a structure in a pair of substrates are bonded to each other, and a protection film 10 may be provided under (referring to FIG. 7 and FIG. 9) the display substrate 1. Hereinafter, upper and lower directions will be based on FIG. 7 and FIG. 9.

In this case, according to the exemplary embodiment of the present invention, the protection film 10 may be provided to protect the display substrate 1 during a process for manufacturing the display panel 200 including the display substrate 1, and may include an adhesive layer and be attached to the bottom of the display substrate 1.

In addition, the protection film 10 has a predetermined thickness, and can enhance strength of the substrate 1 by being attached thereto.

According to the exemplary embodiment of the present invention, an organic light emitting diode (OLED) may be provided in the display substrate 1. However, it is not restrictive and various types of light emission means may be provided.

Next, the driving chip 2 may be located on the anisotropic conductive film 4 attached to the bonding portion P of the display substrate 1 (S402).

In this case, as shown in FIG. 5 and FIG. 6, the driving chip 2 may be aligned using a first aligning device 51 formed in the display substrate 1 and a second aligning device 61 formed in the driving chip 2.

Accordingly, the driving chip 2 can be located in an exact location to be bonded.

Next, the driving chip 2 may be bonded onto the anisotropic conductive film 4 attached to the bonding portion of the display device 1 (S403).

In this case, according to the exemplary embodiment of the present invention, as shown in FIG. 3, the driving chip 2 can be bonded by supporting the lower portion of the display substrate 1 with the support stage 140 and compressing the driving chip 2 provided in the upper portion of the bonding portion P of the display substrate 1 using the compression tip 124.

In this case, in order to prevent the driving chip 2 from being damaged due to high-temperature heat and physical impact directly transmitted from the compression tip 124, a protection plate 6 may be provided between the driving chip 2 and the compression tip 124 as shown in FIG. 2 and FIG. 3.

Meanwhile, the bonding apparatus 100 according to the exemplary embodiment of the present invention can prevent the bonding portion P of the display substrate 1 from being bent by having a bending prevention means provided in a lower portion of the display substrate 1 corresponding to the bonding portion P of the display substrate 1.

In this case, according to the exemplary embodiment of the present invention, the bending prevention means may include the support stage 140, and in further detail, the bending prevention means may include a support stage 140 where a stepped groove 142 may be formed.

Referring to FIG. 7 and FIG. 8, the support stage 140 for supporting the display substrate 1 may be located in the lower portion of the display substrate 1 to which the driving chip 2 may be bonded, and the stepped groove 142 may be formed in the support stage 140.

In this case, according to the exemplary embodiment of the present invention, the stepped groove 142 may have a size that corresponds to the size of the driving chip 2 in a location corresponding to the location of the driving chip 2.

Accordingly, referring to FIG. 8, the stepped groove 142 may be formed in a shape that is similar to the shape of the driving chip 2.

Meanwhile, the depth of the stepped groove 142 may be experimentally determined, and since the stepped groove 142 may be provided to compensate concentration of the stress to the space formed by the input pad 211 and the output pad 221 of the driving chip 2, the depth of the stepped groove 142 may corresponds to a degree of bending of the display substrate 1.

For example, when the driving chip 2 may be mounted to the display substrate 1 of which a thickness of 0.15 mm and the bonding portion P of the display substrate 1 may be bent by 5 μm to a direction of the driving chip 2, the depth of the stepped groove 142 may be 5 μm.

That is, the bonding apparatus 100 according to the exemplary embodiment of the present invention forms a stepped portion using the stepped groove 142 formed in the support stage 140 at the opposite direction side of the space formed by the pads 211, 221, and 231 of the driving chip 2 to evenly distribute stress applied to the display substrate 1 during bonding of the driving chip 2, thereby preventing the display plate 1 from being bent when the driving chip 2 may be compressed by the display substrate 1 even through the display substrate 1 is formed thin.

Meanwhile, in the display panel 200 according to the exemplary embodiment of the present invention, a means that is different from the support stage 140 may be provided as a bending prevention means provided in a lower portion of the display substrate 1 corresponding to the bonding portion P of the display substrate 1 to thereby prevent the bonding portion P of the display substrate 1 from being bent.

Hereinafter, the bending prevention means related to the display panel 200 according to the exemplary embodiment of the present invention will be described with reference to FIG. 9 and FIG. 10.

Figure 9:
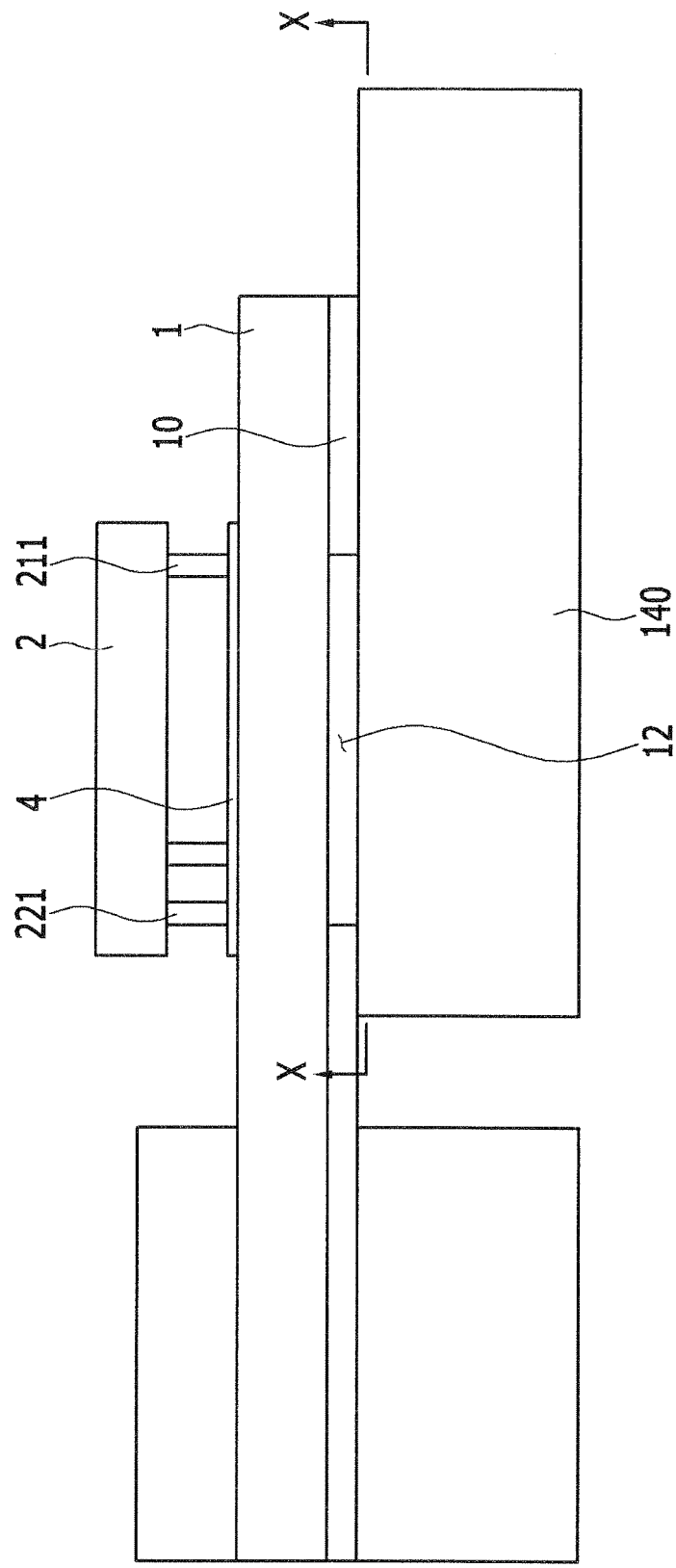
FIG. 9 shows a state that the driving chip is bonded to a display substrate in a display panel according to the exemplary embodiment of the present invention.

FIG. 9 shows the driving chip being bonded to the display substrate in the display panel according to the exemplary embodiment of the present invention. FIG. 10 is a cross-sectional view of FIG. 9, taken along the line X-X.

According to the exemplary embodiment of the present invention, the bending prevention means may include a protection film 10, and in further detail, the bending prevention means may include a protection film 10 where an opening 12 may be formed.

Figure 10:
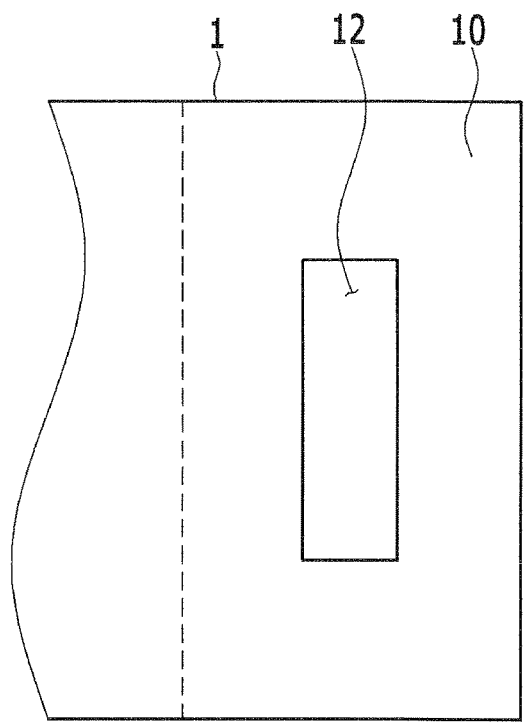
FIG. 10 is a cross-sectional view of FIG. 9, taken along the line X-X.

Referring to FIG. 9 and FIG. 10, the opening 12 may be formed in the lower portion of the display substrate 1 to which the driving chip 2 may be bonded. Further precisely, the opening 12 may be formed in the protection 10 provided between the display substrate 1 and the support stage 140.

In this case, according to the exemplary embodiment of the present invention, the opening 12 may be formed in a location corresponding to the location of the driving chip 2, and the size of the opening 12 corresponds to the size of the driving chip 2.

Accordingly, referring to FIG. 10, the opening 12 may be formed in a shape that is similar to the shape of the driving chip 2.

Meanwhile, the protection film 10 may have a thickness that can be experimentally determined.

That is, the protection film 10 of which a thickness corresponds to a bending height of the display substrate 1 may be attached to the bottom of the display substrate 1.

Accordingly, during compression of the driving chip 2, the stress concentrated to the display substrate 1 can be offset to the opening 12 formed in the protection film 10 attached to the bottom of the display substrate 1 by the space formed by the pads 211, 221, and 231 of the driving chip 2.

Meanwhile, according to the exemplary embodiment of the present invention, the opening 12 may be formed in the shape of a hole penetrating the protection film 10 from one side to the other side, but the present invention is not limited thereto. If the protection film 10 is thick enough, the opening 12 may be formed in the shape of a groove that does not penetrate the protection film 10.

When the opening 12 may be provided as a groove, the depth of the groove may be experimentally determined.

For example, when the when the driving chip 2 may be compressed to the display substrate 1 to which the protection film 10 having a thickness of 10 μm may be attached and the bonding portion P of the display substrate 1 may be bent by 5 μm to the direction of the driving chip 2, the depth of the opening 12 may be 5 μm.

That is, the display panel 200 according to the exemplary embodiment of the present invention forms a stepped portion using the opening 12 formed in the protection film 10 as much as the space formed by the pads 211, 221, and 231 of the driving chip 2 bonded to one side of the display substrate 1 in the other side of the display substrate 1 that may be opposite direction of the space so that stress applied to the display substrate 1 can be evenly distributed during compression of the driving chip 2, thereby preventing the driving substrate 1 from being bent during the compression of the driving chip 2 with the display substrate 1 even through the driving substrate 1 may be formed thin.

As described, the bonding apparatus according to the exemplary embodiment of the present invention can be prevent the display substrate 1 from being bent by having the support stage 140 where the stepped groove 142 may be formed as the bending prevention means in the lower portion of the display substrate 1 to which the driving chip 2 may be bonded.

In addition, the display panel 200 according to the exemplary embodiment of the present invention can prevent the display substrate 1 from being bent by attaching the protection film 10 where the opening 12 may be formed as the bending prevention means to the bottom of the display substrate 1.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel used in a display device, comprising:
    a display substrate;
    a driving chip bonded onto the display substrate;
    an anisotropic conductive film provided between the display substrate and the driving chip; and
    a protection film attached to a bottom of the display substrate, the protection film is provided with an opening to prevent bending of the display substrate when compression on the display substrate occurs via a compression means.

2. The display panel of claim 1, wherein the opening is formed in a location corresponding to a location of the driving chip.

3. The display panel of claim 2, wherein the size of the opening corresponds to the size of the driving chip.

4. The display panel of claim 1, wherein an organic light emitting element is formed in the display substrate.

* * * * *